(12) United States Patent
Oda

(10) Patent No.: US 7,247,829 B2
(45) Date of Patent: Jul. 24, 2007

(54) SOLID-STATE IMAGE SENSOR WITH AN OPTICAL BLACK AREA HAVING PIXELS FOR DETECTING BLACK LEVEL

(75) Inventor: Kazuya Oda, Asaka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/405,610

(22) Filed: Apr. 18, 2006

(65) Prior Publication Data

US 2006/0237629 A1    Oct. 26, 2006

(30) Foreign Application Priority Data

Apr. 20, 2005    (JP)    ............................. 2005-122035
Jun. 2, 2005    (JP)    ............................. 2005-162590

(51) Int. Cl.
*H04N 9/64*    (2006.01)
(52) U.S. Cl. .................................... 250/208.1; 248/243
(58) Field of Classification Search ............. 250/208.1; 348/241, 243, 245
See application file for complete search history.

(56) References Cited

U.S. PATENT DOCUMENTS 5,521,639 A * 5/1996 Tomura et al. ............. 348/243
5,608,455 A * 3/1997 Oda ........................... 348/295
6,614,473 B1 * 9/2003 Kijima ....................... 348/243
6,721,005 B1 * 4/2004 Higuchi ...................... 348/243
6,744,526 B2 * 6/2004 McDermott et al. ....... 358/1.11

FOREIGN PATENT DOCUMENTS

| JP | 2806035 B2 | 7/1998 |
| JP | 2002-64196 A | 2/2002 |
| JP | 2002-290841 A | 10/2002 |
| JP | 2004-312497 A | 11/2004 |

* cited by examiner

*Primary Examiner*—John R. Lee
(74) *Attorney, Agent, or Firm*—Birch, Stewart, Kolasch & Birch, LLP

(57) ABSTRACT

A digital camera includes an image sensor having an array of CCD (Charge-Coupled Device) cells on which an optical image is focused via a lens and a shutter. The image sensor produces an image signal by photoelectric conversion. The image signal is clamped by an analog front end circuit, which feeds a processed analog signal to an analog-to-digital converter. The resultant digital signal is input to a signal processor. The analog front end circuit switches horizontal scanning lines to be clamped in accordance with image pickup information. The horizontal scanning lines to be clamped lie in an optical black area where a photodiode is included in each CCD cell or an optical black area where the former is not included in the latter.

5 Claims, 12 Drawing Sheets

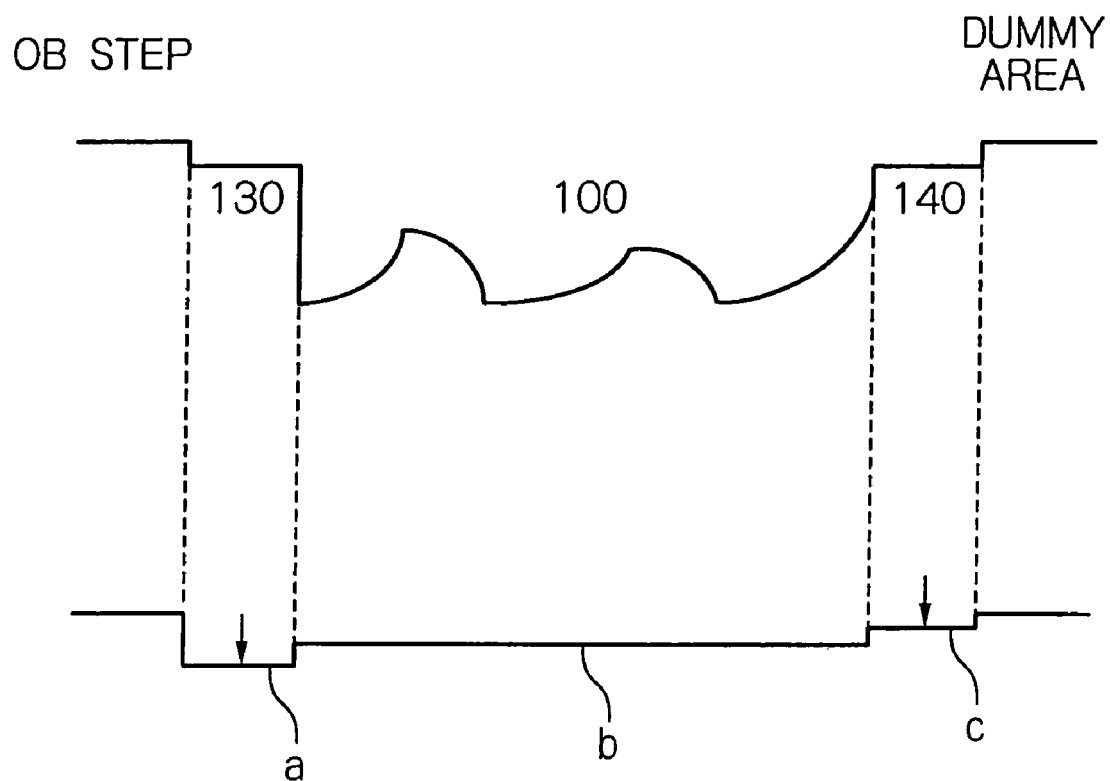

SOLID-STATE IMAGE SENSOR WITH AN OPTICAL BLACK AREA HAVING PIXELS FOR DETECTING BLACK LEVEL

BACKGROUND OF THE INVENTION

1. Field of the Invention

The present invention relates to a solid-state image sensor and an image pickup apparatus including the same. More particularly, the present invention relates to a solid-state image sensor capable of enhancing image quality by stabilizing a signal level, e.g. a black level, and capable of accurately correcting the black level when mounted on a digital camera, scanner or similar image input apparatus, and to an image pickup apparatus including the same.

2. Description of the Background Art

A digital camera, for example, is configured to pickup a desired subject by focusing the optical image of the subject on a solid-state image sensor. The current trend in the imaging art is toward a solid-state image sensor having pixels densely arranged thereon for improving the quality of an image picked up thereby. Japanese patent laid-open publication No. 2002-290841, for example, discloses an image pickup apparatus including an effective pixel area, or image pickup area, and a plurality of optical black (OB) areas. The image pickup apparatus disclosed is constructed such that, when intense light is incident on one optical black area, an accurate reference black-level signal is obtained from the remaining optical black areas in order to reduce blackout.

Japanese patent No. 2806035, for example, teaches a solid-state image sensor including an effective pixel area and an optical black area surrounding it. In this case, when the image of a subject picked up by the image sensor is to be reproduced from image data representative of the image, a black level is corrected by use of data output from the optical black area. The above patent further teaches a video signal processing circuit for controlling the potential variation of a video signal during black-level periods.

However, the prior art schemes stated above have a problem that a plurality of optical black areas must be arranged above and below the effective pixel area in the imaging plane, and a problem that control over switching of the optical black areas and other sophisticated control processing are required. Consequently, it is difficult to further enhance image quality in a high-sensitivity pickup mode, a long-exposure pickup-mode or similar image pickup mode.

A conventional optical black area is implemented by a shield layer formed on the top of the individual photoelectric transducer or photosensitive cell. This, however, gives rise to a problem that, when the level of an output signal from the optical black area varies due to temperature elevation or extremely long exposure time and rises relative to the black-level output of the effective pixel area, the variation of a black signal output from the effective pickup area is cut off by the black level of the optical black area, rendering dark regions practically "flat black". Once the variation of black gradation picked up by the effective pixel area is cut off by the output level of the optical black area, then the variation of the black gradation cannot be restored. It is therefore necessary to correct the black level with high accuracy.

On the other hand, when temperature is low or when exposure time is extremely short, the black level output from the effective pixel area rises relative to the black level of the optical black area, rendering dark regions light. This problem, however, can be coped with by signal processing and therefore not so critical.

SUMMARY OF THE INVENTION

It is an object of the present invention to provide a solid-state image sensor capable of further enhancing image quality and correcting the black level with high accuracy, and an image pickup apparatus using the same.

A solid-state image sensor in accordance with the present invention includes an effective pixel area which has a plurality of photosensitive cells arranged for each generating a signal charge corresponding to an amount of incident light, and an optical black area shielded from the incident light. The optical black area is positioned at the front and rear sides of horizontal scanning lines. The horizontal scanning lines include first horizontal scanning lines, including first zones in which the photosensitive cells are present, and second horizontal scanning lines, including second zones in which the photosensitive cells are absent, arranged alternately with each other at the front side at predetermined intervals each.

Also, an image pickup apparatus for picking up a field to generate an image signal representative of the field in accordance with the present invention includes a solid-state image sensor which includes an effective pixel area having a plurality of photosensitive cells for generating a respective signal charge corresponding to an amount of incident light each, and an optical black area shielded from the incident light. The optical black area is positioned at the front and rear sides of horizontal scanning lines. The horizontal scanning lines include first horizontal scanning lines, including first zones in which the photosensitive cells are present, and second horizontal scanning lines, including second zones in which the photosensitive cells are absent, arranged alternately with each other at the front side at predetermined intervals each. The solid-state image sensor is driven by a driver to output an image signal in accordance with exposure. An analog circuit clamps the image signal output from the solid-state image sensor while a controller controls clamping executed by the analog circuit. The controller causes the analog circuit to selectively clamp the first horizontal scanning lines or the second horizontal scanning lines.

Further, a solid-state image pickup apparatus for picking up a field to generate an image signal representative of the field in accordance with the present invention includes an effective pixel area having effective pixels and an optical black area surrounding it and having pixels. A plurality of kinds of pixels different in structure from each other are arranged in the optical black region for detecting a black level of the image signal.

BRIEF DESCRIPTION OF THE DRAWINGS

The objects and features of the present invention will become more apparent from consideration of the following detailed description taken in conjunction with the accompanying drawings in which:

FIG. 16 shows an output level of a signal output from the effective pickup area and that of a signal output from the optical black area included in the alternative embodiment.

DESCRIPTION OF THE PREFERRED EMBODIMENTS

Figure 1:
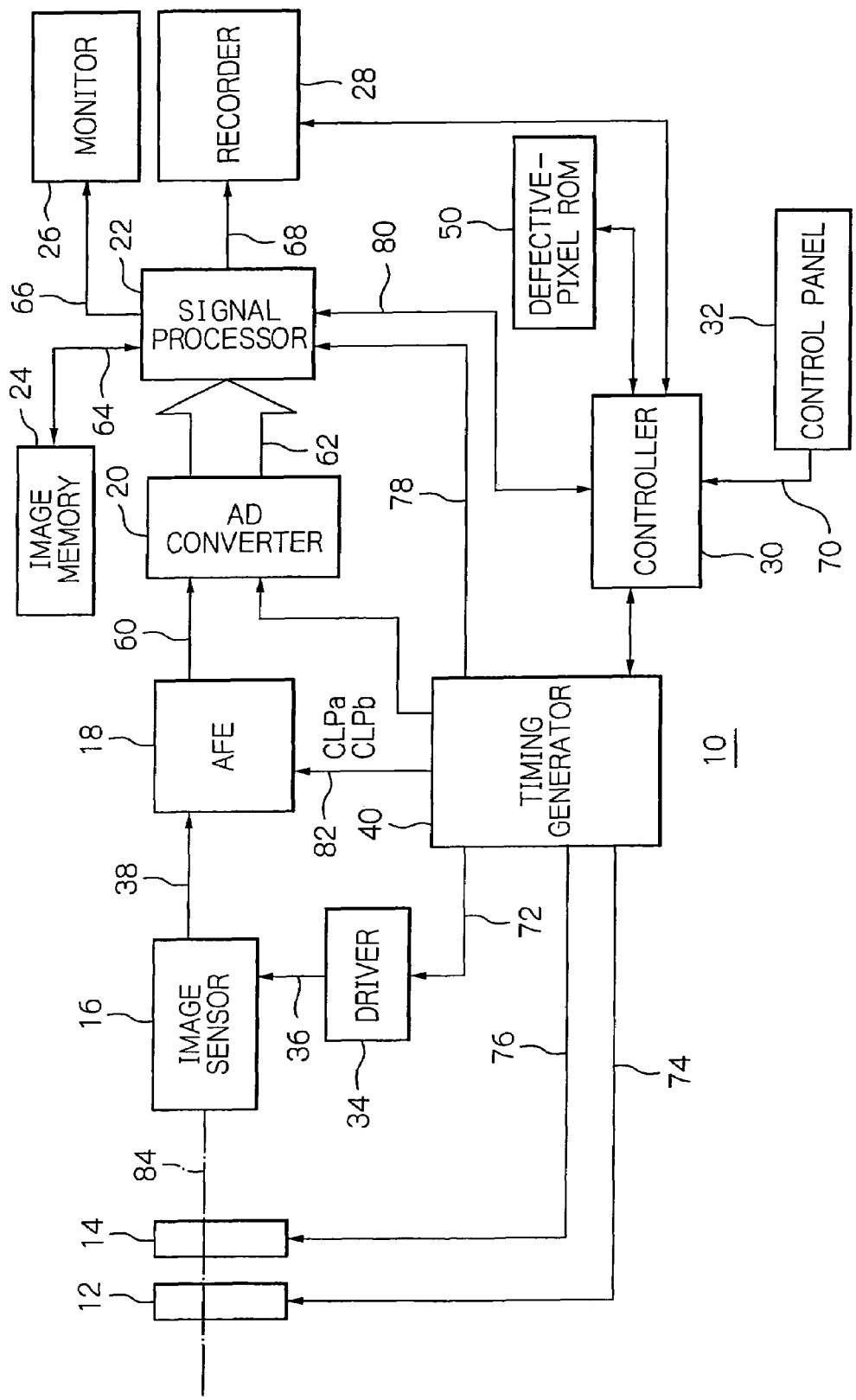
FIG. 1 is a schematic block diagram showing a preferred embodiment of an image pickup apparatus in accordance with the present invention.

Referring now to FIG. 1 of the accompanying drawings, an image pickup apparatus to which the present invention is applied is implemented as a digital camera by way of example. As shown, the digital camera, generally 10, includes a solid-state image sensor 16. When an optical shutter 14 is opened, light representative of a subject field is incident on the image sensor 16 via a lens system 12 and converted to an electric pixel signal 38 thereby.

An analog front end (AFE) processor 18 performs correlated double sampling (CDS) and clamping with the pixel signal 38 output from the image sensor 16, and feeds the resulting analog signal 60 to an analog-to-digital (AD) converter 20. The AD converter 20 converts the analog signal 60 to corresponding digital image data and delivers the image data 62 to a signal processor 22. The signal processor 22 writes the image data 64 in an image memory 24 for thereby preparing image data to be displayed and recorded. Such image data are also output to a monitor 26 and a recorder 28 as depicted with connections 66 and 68, respectively. The image pickup processing described above is executed under the control of a controller 30 in response to a command signal 70 output from a control panel 32 connected to the controller 30. In the illustrative embodiment, the controller 30 is implemented by a microcomputer including a CPU (Central Processing Unit). The recorder 28 is loaded with a semiconductor memory or similar data recording medium for storing the image data 64 therein.

The solid-state image sensor 16, positioned on the focusing plane, not shown, of the lens system 12, may advantageously be implemented by a color charge-coupled device (CCD) image sensor of interline transfer (IT) type. A number of photodiodes (PDs), not shown, are arranged on the image pickup surface of the image sensor 16 to form an array of photosensitive cells, which transform incident light 84 to a corresponding signal charge each. The image sensor 16 is driven with a drive signal 36 provided by a driver 34. The drive signal 36 includes a vertical and a horizontal transfer clock $\phi V$ and $\phi H$, respectively, and an overflow drain (OFD) voltage and other various voltages, in accordance with the operation mode and read-out control, so that the signal charges stored in the photodiodes are read out as pixel signals. The pixel signals thus produced are fed to the analog front end circuit 18 from the output 38 of the image sensor 16.

More specifically, the driver 34 generates the drive signal 36 in response to signals 72 including H (horizontal) and V (vertical) pulses and OFD pulses fed from a timing generator 40. The timing generator 40 further feeds a control signal 74 to the lens system 12 for controlling the focal position of the lens system 12, and feeds another control signal 76 to the optical shutter 14 for selectively opening or closing it.

Figure 2:
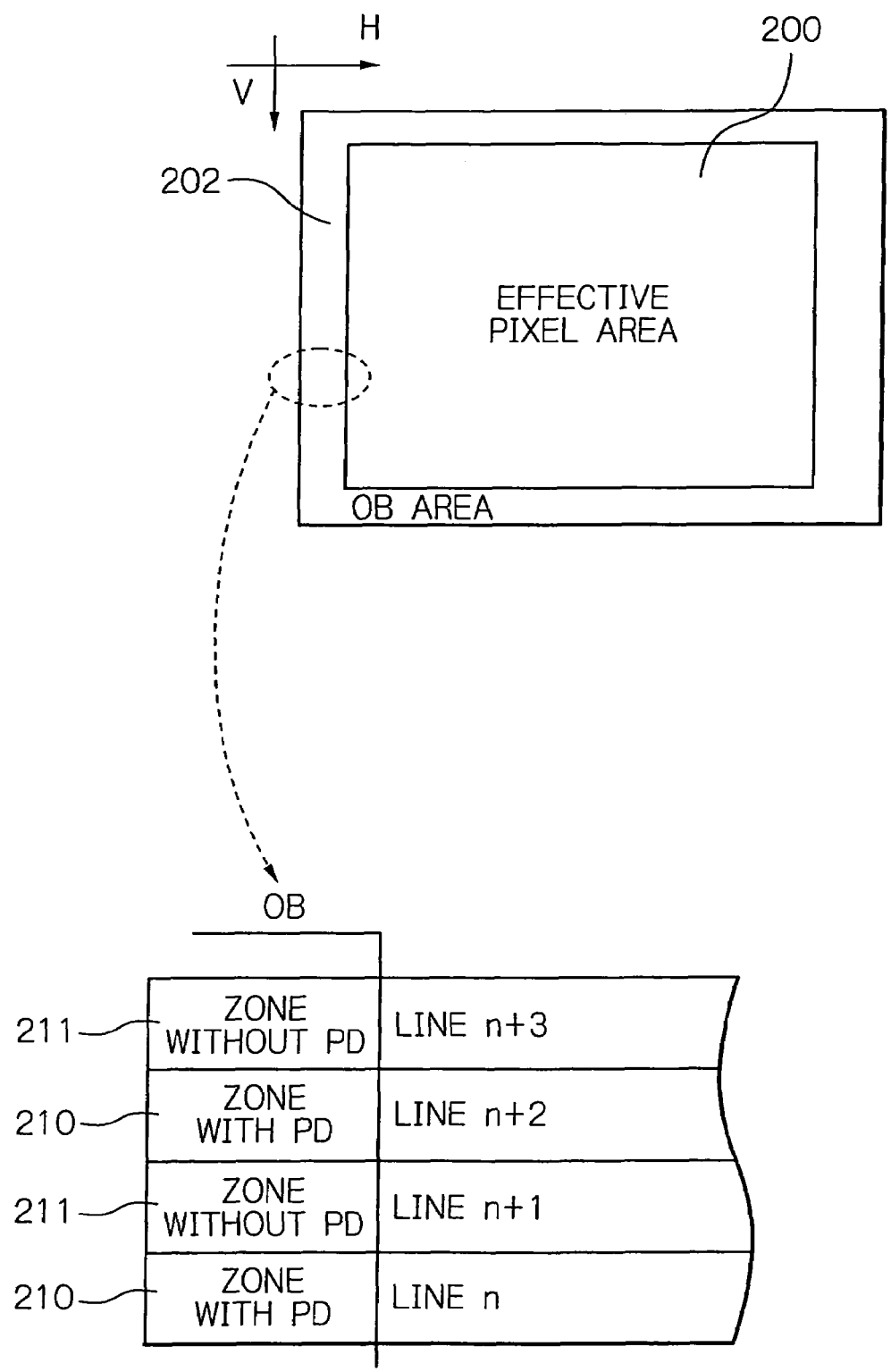
FIG. 2 is a plan view schematically showing a specific configuration of a solid-state image sensor included in the illustrative embodiment shown in FIG. 1 and including an effective pixel area, an optical black area and zones with photodiodes and zones without photodiodes alternately arranged in the optical black area.

FIG. 2 schematically shows a specific arrangement of the image sensor 16 in a plan view. The image sensor 16 includes photodiodes or photosensitive cells arranged in bidimensional arrays, forming a photosensitive array or light incidence surface, although not shown specifically. As shown in FIG. 2, the image sensor 16 is made up of an effective pixel area or pickup area 200 and an optical black (OB) area 202 which is optically shielded from light. The photodiodes are arranged in the effective pixel area 200 such that signal charges generated therein can be read out.

In the front portion of the optical black area 202 positioned at the left-hand side of the effective pixel area 200 in the figure, zones with photodiodes 210 and zones without photodiodes 211 are arranged alternately with each other and are positioned at the interval of integral number of the horizontal lines each. More specifically, the zones with photodiodes 210 are arranged on even-numbered lines n, n+2 and so forth while the zones without photodiodes 211 are arranged on odd-numbered lines n+1, n+3 and so forth. The zones with photodiodes 210 and zones without photodiodes 211 should preferably be arranged at the interval of a horizontal scanning line or at a preselected interval each.

In the illustrative embodiment, the photodiodes or photosensitive cells in the front part of the optical black area 202 are arranged on the image pickup surface of the image sensor 16 in a honeycomb pattern, i.e. shifted from each other by one-half of a pixel pitch in the horizontal and vertical directions. If desired, the zones with photodiodes and zones without photodiodes may be located in the rear portion of the optical black area 202.

Figure 3:
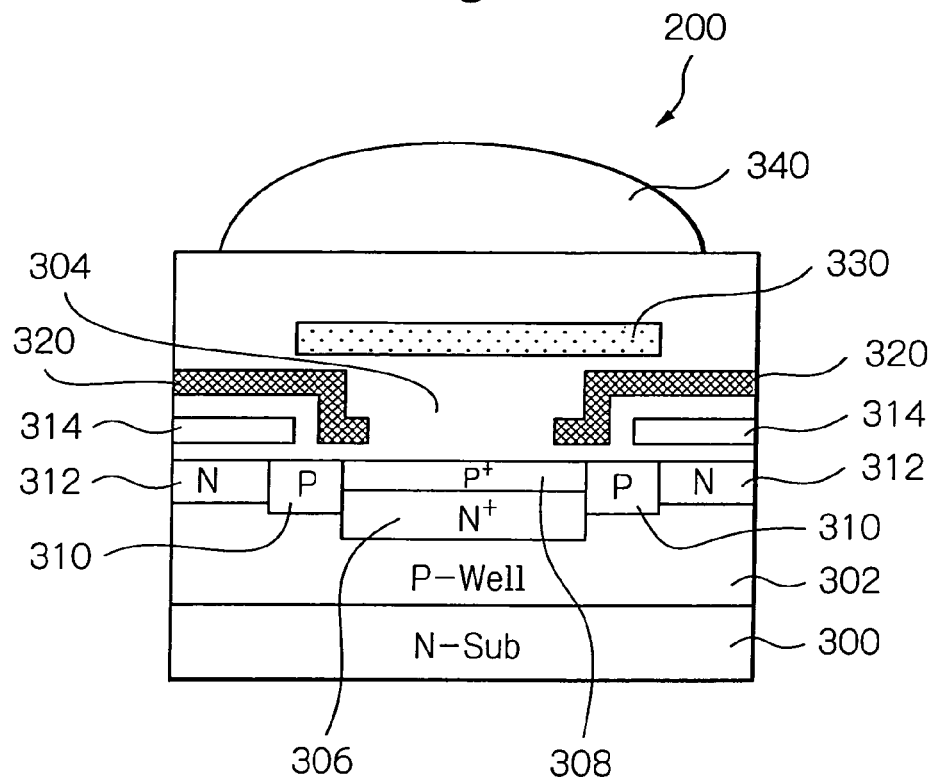
FIG. 3 is a vertical section showing one of a number of cells arranged in the effective pixel area.

FIG. 3 shows a vertical section having a specific structure of any one of the photosensitive cells 200 arranged in the effective pixel area 200. As shown, the effective pixel area 200 includes an N-type semiconductor substrate 300 on which a P-type potential well 302 is formed. An N$^+$ layer 306 and a P$^+$ layer 308 are formed in this order on the portion of the P-type well 302 corresponding to an optical aperture 304, which will be described later, forming a photosensitive region implemented as a photodiode. P-type channel stoppers 310 are formed at opposite sides of the photodiode while a buried channel 312, functioning as a vertical transfer register, are positioned at the outside of the channel stopper 310 and formed of an N-type semiconductor. Above the buried channel 312, a transfer electrode 314 is positioned.

Further, an optical shield layer 320 for intercepting incident light beams 84 covers the transfer electrode 314 and is formed with the aperture 304 mentioned earlier that allows incident light to reach the photodiode. The $N^+$ layer 306 and $P^+$ layer 308 are positioned beneath the aperture 304. A color filter segment 330 is formed above the aperture 304 while a microlens 340 is formed above the color filter segment 330. The effective pixel area 200 includes a number of photosensitive cells 20 structured as described above.

Figure 4:
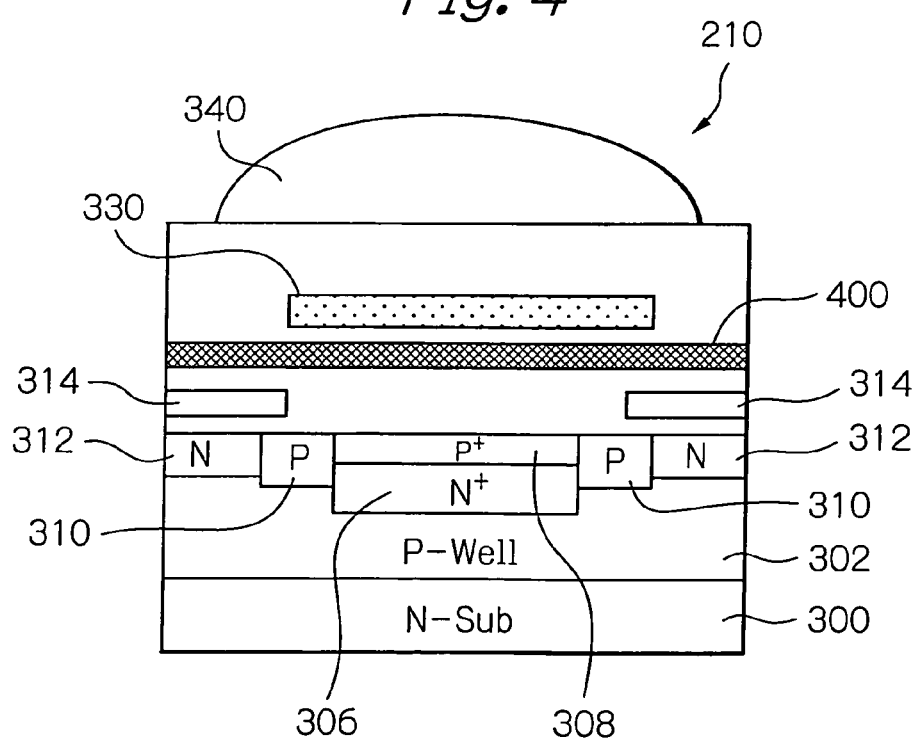
FIG. 4 shows a vertical section of one of the photosensitive cells positioned in any one of the zones with photodiodes included in the optical black area.

FIG. 4 illustrates a vertical section of a specific structure of one of the photosensitive cells 210 included in one of the zones 210 with photodiodes. As shown, the cell of the zone with photodiodes 210 may be the same as the cell of the effective pixel area 200, FIG. 3, except that the shield layer 320 is extended to form an optical shield layer 400 that covers not only the transfer electrodes but also the photodiode. The remaining structural elements of the zone with photodiodes 210 are identical with the structural elements of the effective pixel area 200 and will not be described specifically in order to avoid redundancy. In the figures, of course, like components are designated with the same reference numerals.

Figure 5:
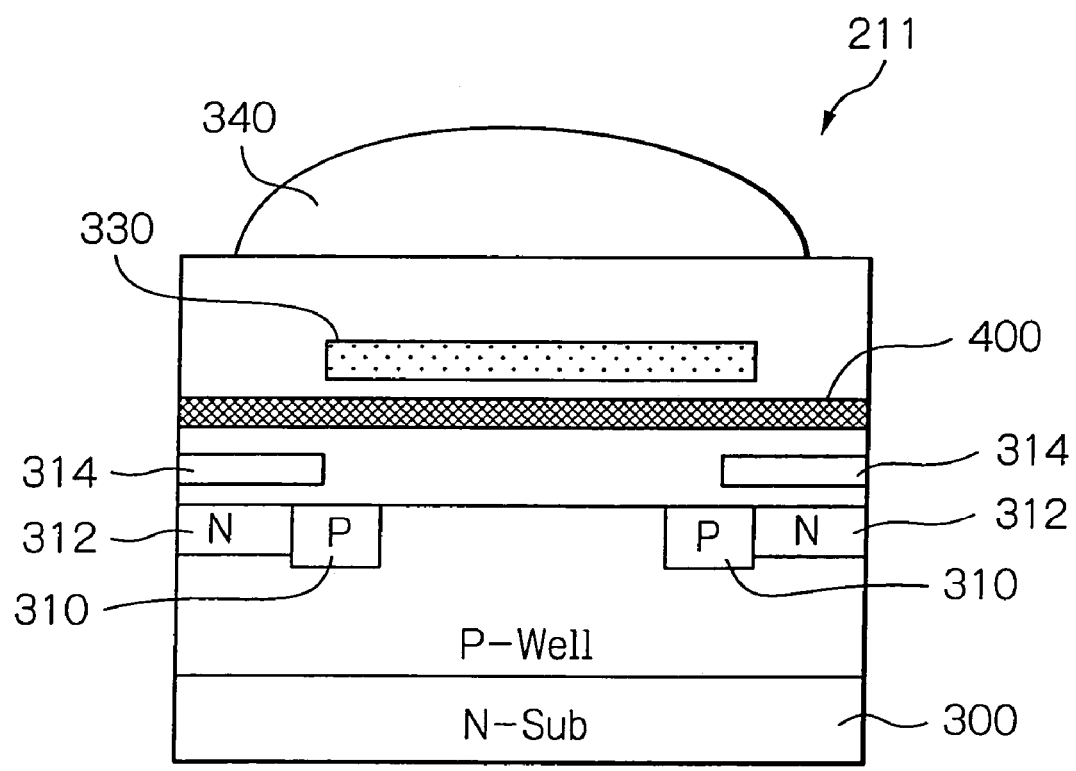
FIG. 5 shows a vertical section of one of the photosensitive cells positioned in any one of the zones without photodiodes also included in the optical black area.

FIG. 5 shows, in a vertical sectional view, one of the cells in the zones 211 without photodiodes. As shown, the zone 211 without photodiodes may be the same as the zone 210 with photodiodes except that the $N^+$ layer 306 and $P^+$ layer 308, constituting a photodiode, are absent. The remaining structural elements of the zone without photodiodes 211 are identical with the structural elements of the zone with photodiodes 210, FIG. 4, and will not be described specifically in order to avoid redundancy.

Referring again to FIG. 1, the analog front end circuit (AFE) 18, connected to the output 38 of the image sensor 16, is an analog signal processing circuit configured to execute CDS sampling and automatic gain control (AGC) on the input pixel signal 38. Specifically, the analog front end circuit 18 includes a clamping circuit, not shown, configured to clamp the pixel signal 38 in order to hold the black level of the pixel signal and correct the black level. The output 60 of the analog front end circuit 18 is connected to the signal processor 22 via the AD converter 20. In the illustrative embodiment, the signal processor 22 is adapted to transform the color image signal 62, containing color component signals, to the signals 64, 66 and 68 including a luminance signal and a chrominance signal representative of a luminance and a color difference, respectively, in response to timing signals 78 including a vertical and a horizontal synchronous signal VD and HD, respectively, and an operational clock signal CLK fed from the timing generator 40. The signal processor 18 feeds the luminance signal to the controller 30 over a connection 80, so that the controller 30 can determine an exposure value in dependent upon the image signal and control the pickup processing.

The signal processor 22 provides the monitor 26 and recorder 28 with image signals thus produced through the digital signal processing. The recorder 28 serves as recording the image data 68 received from the signal processor 22 in the data recording medium loaded thereon. In the illustrative embodiment, the recorder 28 includes a compressing circuit, not shown, for coding the image data by compression.

The controller 30 controls various sections of the camera 10 in response to various command signals 70, including a shutter release signal, fed from the control panel 32. Particularly, the controller 30 controls the image sensitivity of the camera 10 in accordance with sensitivity selected on the control panel 32 by the operator, and is capable of automatically setting a shutter speed and an exposure value although they may, of course, be set by the operator. Further, the controller 30 controls pixel interpolation on the basis of defective-pixel data stored in a defective-pixel store 50, which may be implemented by a read-only memory (ROM).

Moreover, the controller 30 has a function of switching, when a long-term exposure, or slow shatter, mode is elected by the operator, control over the analog front end circuit 18 via the timing generator 40. More specifically, when an exposure time longer than a preselected period of time is selected, the controller 30 causes the analog front end circuit 18 to clamp the portions of the image signal 38 representative of the zones without photodiodes 211, FIG. 2, of the optical black area 202. At this instant, the timing generator 40, under the control of the controller 30, feeds the analog front end circuit 18 with clamp pulses 82 that clamp the signals originating from the zones without photodiodes 211, but do not clamp the signals from the zones with photodiodes 210. This is successful in implementing a reference level in a condition wherein the adverse influence of dark currents generated in the photodiodes during long-exposure in a vertical scanning period. In addition, when the image data should be produced, the controller 30 is capable of preparing an image file including the image data and pickup information representative of horizontal scanning lines on which clamping was effected.

As stated above, in the illustrative embodiment, the zones with photodiodes 210 and zones without photodiodes 211 are arranged at the predetermined intervals each in the front portion of the optical black area 202 as if they were lines alternating with each other. It is therefore possible to effect clamping at the timing of signals read out from the zones without photodiodes 211 and free from the adverse influence of dark currents generated in the photodiodes in, e.g. the long-exposure mode, thereby insuring a reference signal with a stable black level.

Figure 6:
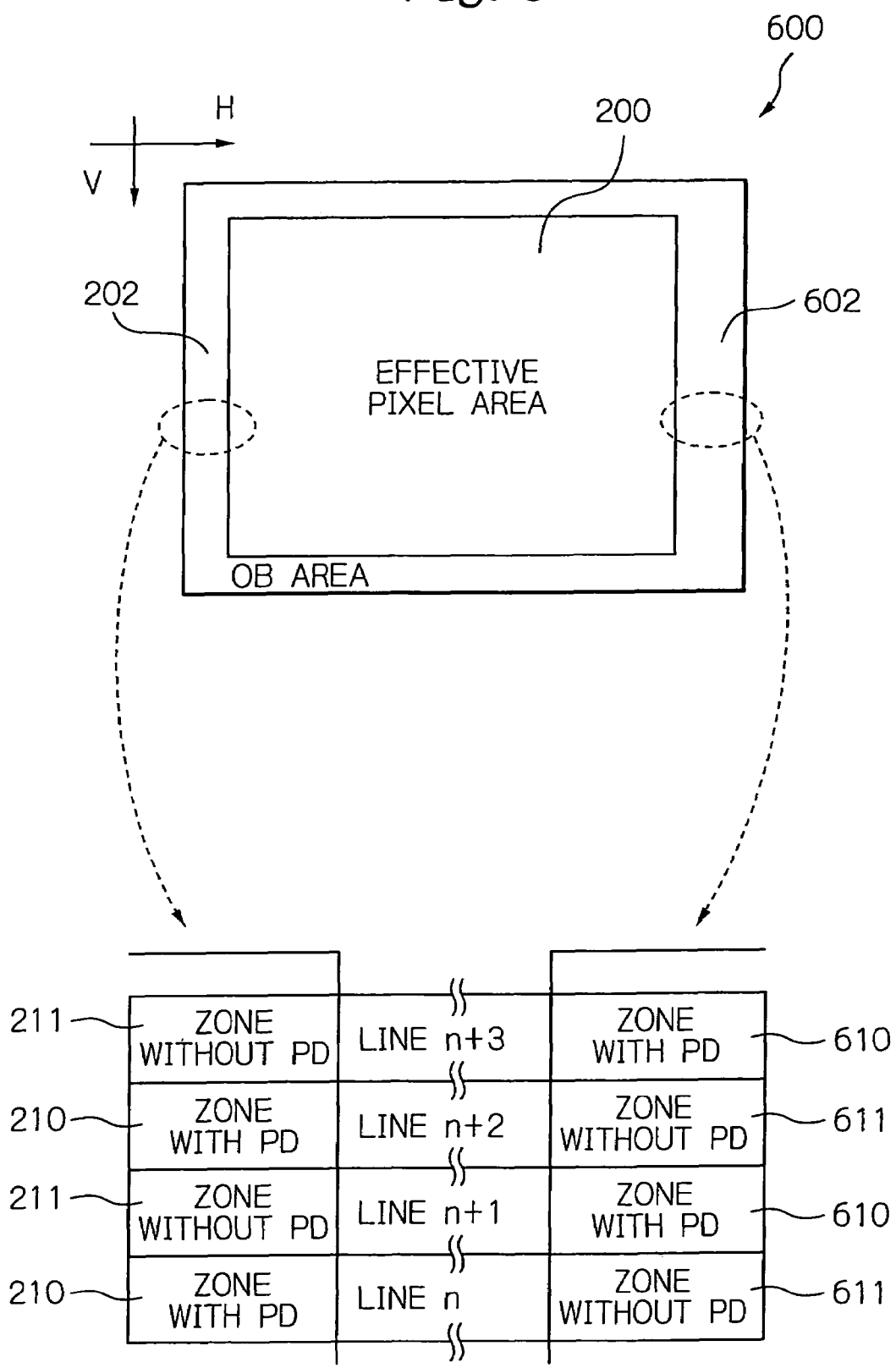
FIG. 6 is a view, similar to FIG. 2, schematically showing an alternative specific configuration of the solid-state image sensor in which the zones with photodiodes and zones without photodiodes are arranged in the rear portion of the optical black area also.

Now, with reference to FIG. 6, described will be an alternative specific arrangement of the image sensor 16. As shown, the image sensor, labeled 600, includes an effective pixel area 200 and an optical black area 202 like the image sensor 16 of FIG. 2. Zones with photodiodes 611 and zones without photodiodes 610 are arranged in the rear optical black portion 602 positioned at the right-hand side, in the figure, of the effective pixel area 200 alternately with each other.

More specifically, the zones with photodiodes 610 are arranged on odd-numbered lines n+1, n+3 and so forth while the zones without photodiodes 611 are arranged on even-numbered lines n, n+2 and so forth. In this manner, the zones without photodiodes 611 formed in the rear part of the optical black area 600 are positioned on the same horizontal lines as the zones with photodiodes 210 formed in the front part of the optical black area 202, FIG. 2, while the zones with photodiodes 610 are positioned on the same lines as the zones without photodiodes 211. As for the rest of the configuration, the image sensor 600 may be identical with the image sensor 16.

Figure 7:
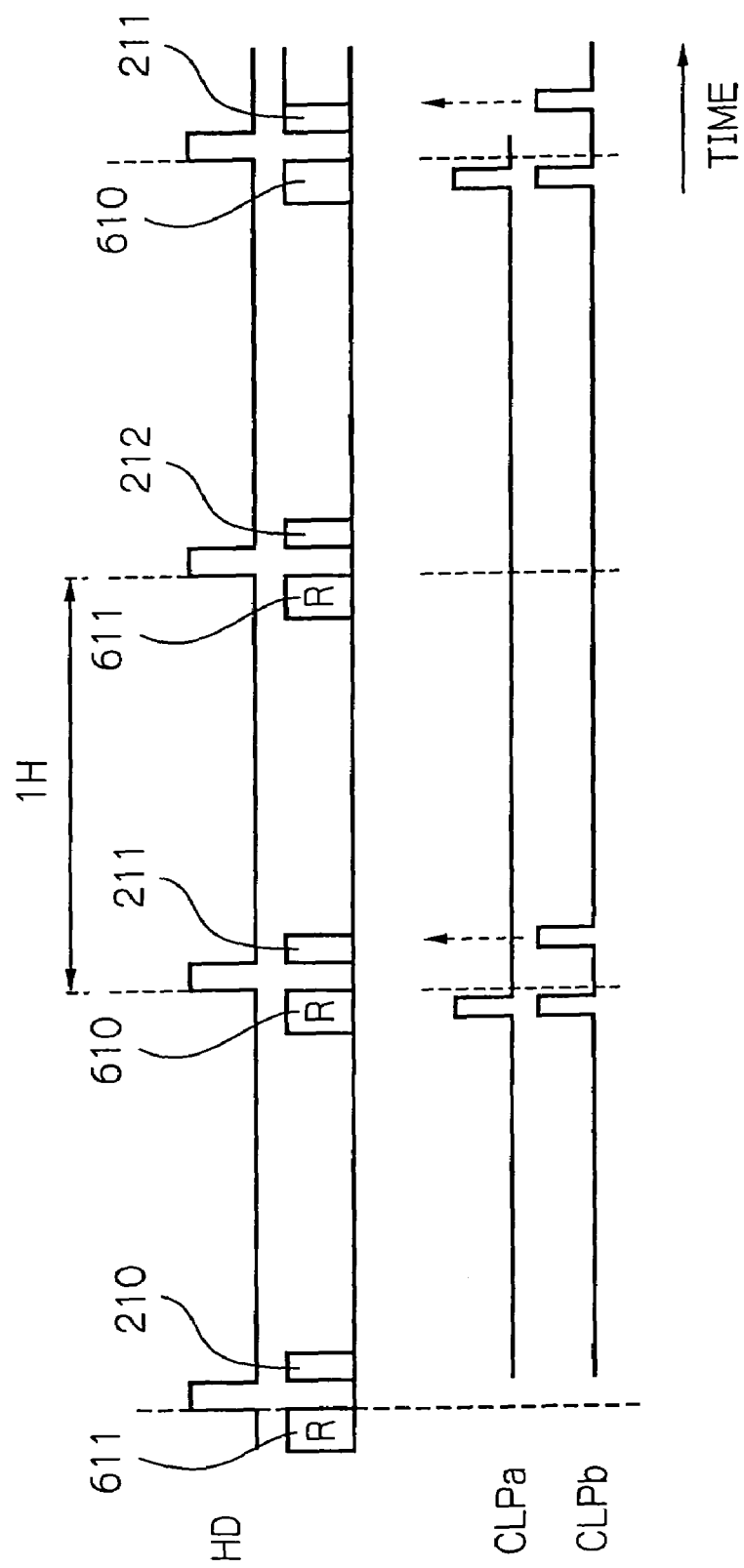
FIG. 7 is a timing chart useful for understanding a specific clamping operation effected by clamp pulses.

Reference will be made to FIG. 7 for describing control over the analog front end circuit 18 to be executed when the image sensor 600 of FIG. 6 is substituted for the image sensor 16 of FIG. 2. As shown, when the image signal is to be clamped by clamp pulses CLPa generated in the event of usual clamping, a pulse signal for clamping part of the image signal corresponding to the rear part of the optical black area 202 is fed to the analog front end circuit 18, FIG. 2. In this case, because not all lines are clamped, other clamp pulses CLPb are fed to the analog front end circuit 18 in accordance with the high-sensitivity mode, long-exposure mode or similar mode selected by the operator.

In the high-sensitivity mode or the long-exposure mode, for example, part of the image signal corresponding to the front part of the optical black area 202 is clamped at the same time as part of the image signal corresponding to the rear part of the same is clamped by the clamp pulses CLPa, so that the clamp potential at the front side is stabilized.

Generally, in an image sensor, dark currents generated in vertical transfer paths or VCCDs (Vertical CCDs) are greater than dark currents generated in photodiodes. More specifically, dark currents generated in the VCCDs during the transfer of signal charges are far greater than dark currents generated in photodiodes. In the long-exposure mode, for example, dark currents generated in photodiodes increase during exposure effected at a shutter speed that extends a storage time in the photodiodes, resulting in local irregularity in dark current and therefore noise in shadow regions in a reproduced picture. Thus, by switching horizontal scanning lines to be clamped in accordance with the pickup mode, it is possible to prevent, e.g. dark regions from being rendered practically flat black due to the analog clamping.

More specifically, in the long-exposure mode exceeding a preselected period of time, the controller 30 causes the analog front end circuit 18 to clamp the lines of the zones without photodiodes because the clamp potential is apt to rise on the lines of the zones with photodiodes due to white noise or similar defect. On the other hand, in the high-sensitivity mode, the controller 30 causes the analog front end circuit 18 to clamp signals on the lines of the zones with photodiodes because the image signal to be dealt with falls in level and influences the image quality of shadow regions due to small differences in level.

The control over clamp switching stated above is effective even when, e.g. a processed image signal is recorded in a recording medium in the raw format, i.e. in the form of R (red), G (green) and B (blue) signals, by switching control in accordance with pickup information representative of, e.g. sensitivity selected or long exposure.

As stated above, in the configuration shown in FIG. 6, the zones with photodiodes 610 and zones without photodiodes 611 are arranged in the rear optical black portion 602 alternately with each other, and each is spaced by an integer number of lines. With this configuration, the illustrative embodiment is free from the influence of light accidentally transmitted through the optical shield layer of the optical black area and the influence of dark currents generated in the photodiodes in the long-exposure mode for thereby insuring accurate correction of the black level.

Further, because the front optical black portion and rear optical black portion are opposite to each other as to the relation between the zones with photodiodes and zones without photodiodes, the illustrative embodiment obviates omission otherwise occurring due to the clamping of only the rear optical black portion, and enhances potential stability by effecting clamping in the front optical black portion.

Moreover, by switching the lines to be clamped in dependence upon the exposure time, subjective luminance information, ISO (International Standards Organization) sensitivity or similar pickup information, the illustrative embodiment obviates the influence of, e.g. dark regions rendered practically black. In this case, horizontal scanning lines from which black-level correction data should be produced on the basis of the pickup information may be determined in accordance with the control over the switching of clamp lines. If desired, the clamp-line switching control and clamped lines may be recorded as pickup information, so that positions where the subtraction of the black level should be effected can be determined in accordance with the above-stated lines in the event of image processing to be executed later. This is desirable in the case where raw-data file output is to be processed.

Figure 8:
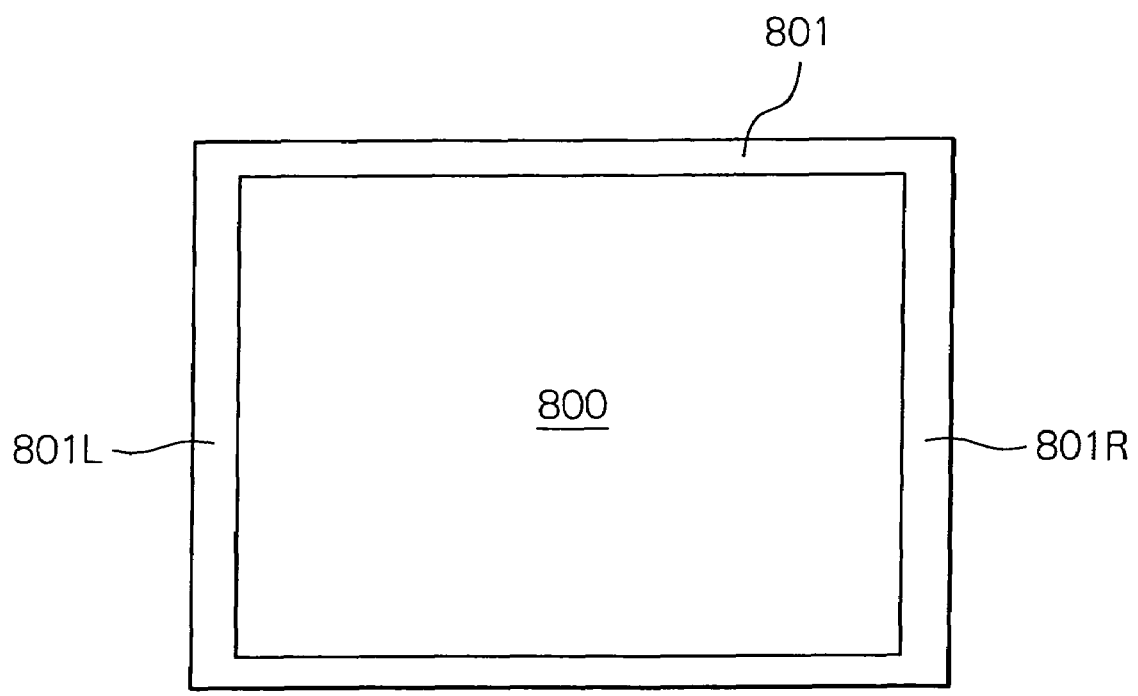
FIG. 8 is a plan view schematically showing an alternative embodiment of the image pickup apparatus in accordance with the present invention.

An alternative embodiment of the present invention will be described hereinafter. FIG. 8 is a plan view showing a solid-state image sensor of the alternative embodiment. As shown, the image sensor illustrated is generally made up of an effective pixel area 800 and an optical black area 801 surrounding it. A number of photosensitive cells are arranged in each of the effective pixel area 800 and optical black area 801 in a matrix. The photosensitive deices, i.e. photodiodes in the optical black area 801 each are optically shielded from incident light by a respective shield layer.

Figure 9:
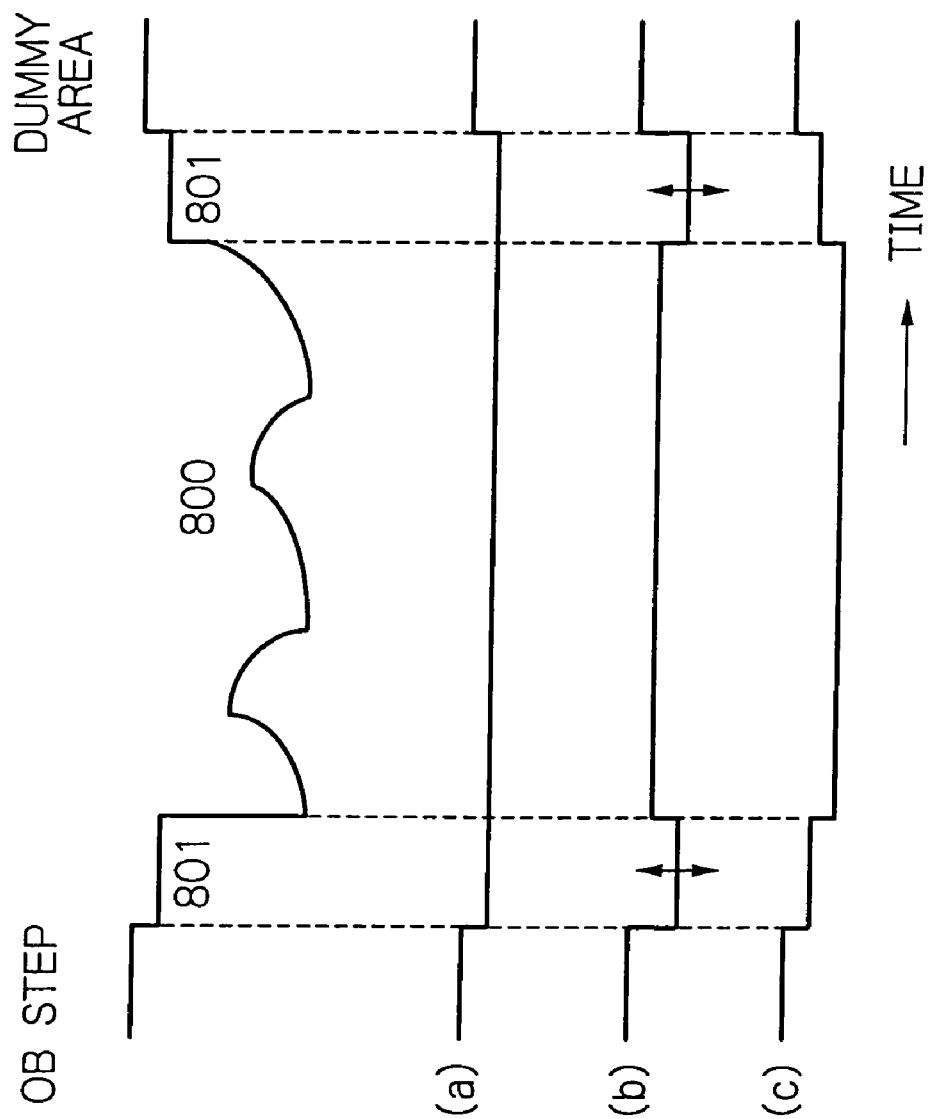
FIG. 9 shows the output level of a signal output from an optical black area and that of a signal output from an effective pixel area included in a conventional solid-state image sensor.

FIG. 9 shows output levels of the image sensor to appear in a particular condition in lines (a) (b) and (c), as will be described specifically later. Dummy pixels, not shown in FIG. 8, are arranged in the most peripheral portion of the image sensor surrounding the optical black area 801 while the effective pixel area 800 is formed inside of the optical black area 801. A signal derived from dark currents is output from the optical black area 801 while image data representative of a subject picked up are output from the effective pixel area 800.

FIG. 9, line (a), shows ideal output levels of the image sensor to appear when the entire photosensitive array or surface of the image senor is shield from incident light. As understood from the figure, a black level output from the optical black area 801 and a black level output from the effective pixel area 800 are coincident with each other. In practice, however, the output level of the optical black area 801 varies in dependence upon, e.g. temperature. For example, as seen from FIG. 9, line (b), when the black level output from the optical black area 801 rises relative to the black level output from the effective pixel area 800 due to high temperature or extremely long exposure time, changes in the black level output from the effective pixel area 800 are practically cut off by the black level of the optical black portion 801, rendering dark regions entirely flat black.

On the other hand, as shown in FIG. 9, line (c), when the black level output from the effective pixel area 800 rises relative to the black level output from the optical black area 801 due to low temperature or extremely short exposure time, dark regions are unexpectedly rendered light. This problem, however, can be coped with by signal processing and is therefore not critical, as stated earlier.

Figure 10:
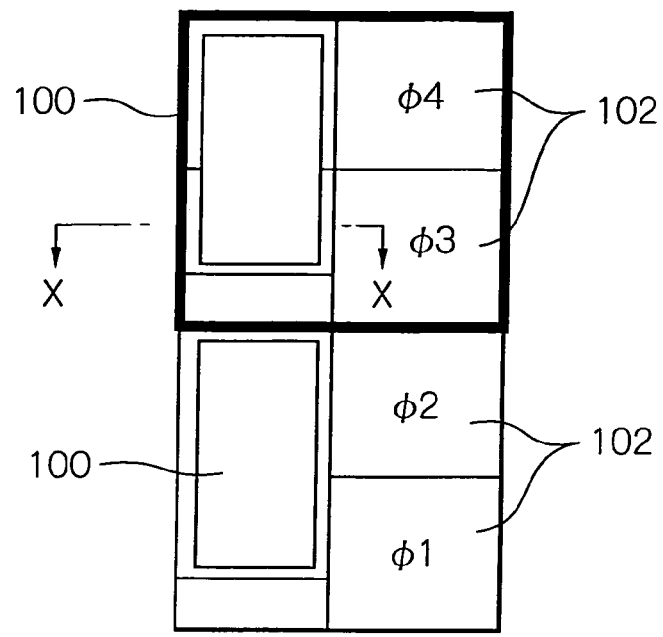
FIG. 10 is a plan view schematically showing two of a number of pixels arranged in a solid-state image sensor included in the alternative embodiment.

FIG. 10 is a plan view showing a specific configuration of a photosensitive cell or pixel formed in each of the effective pixel area 800 and optical black area 801 included in the illustrative embodiment, and also implemented by an IT-CCD device mentioned previously. While FIG. 10 shows only two cells or pixels adjoining each other in the vertical direction, a number of such cells are of course arranged in both of the vertical and horizontal directions. As shown, each cell has a substantially square shape in which a photodiode or photoelectric transducer 100 and a vertical transfer path 102 are formed at the left-hand side and right-hand side, as viewed in FIG. 10, respectively.

Figure 11:
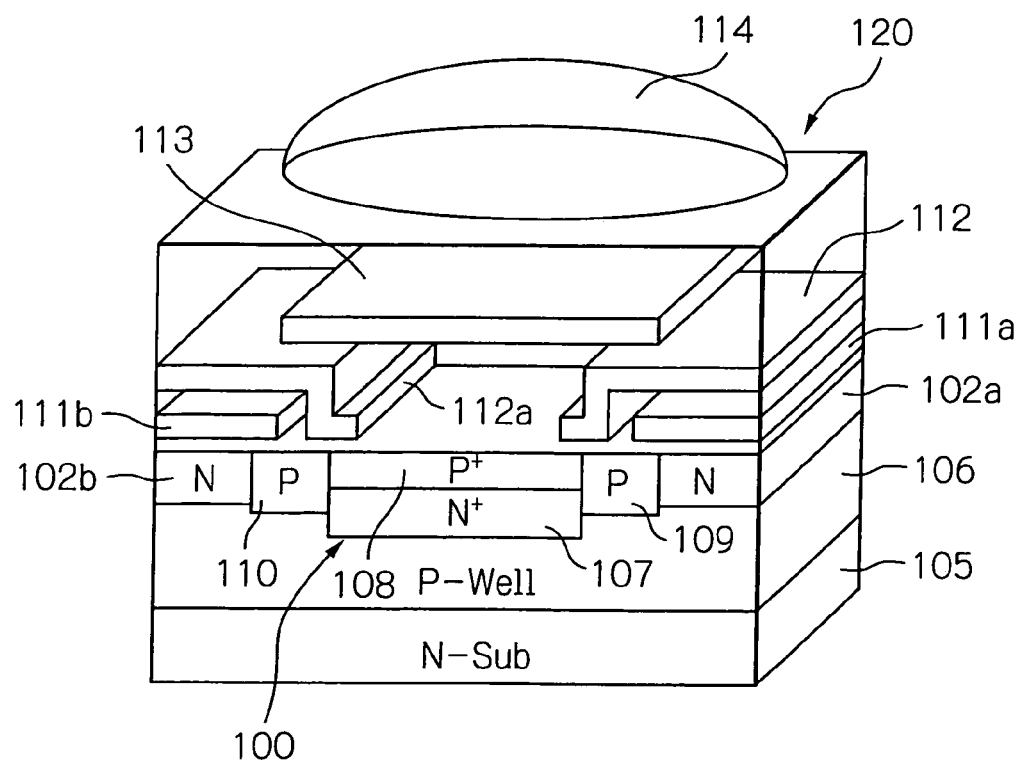
FIG. 11 is a sectional perspective view showing a specific configuration of one of the photosensitive cells positioned in an effective pixel area included in the image sensor of FIG. 10.

FIG. 11 is a sectional perspective view cut along a line X-X of FIG. 10 showing one of the cells, labeled 120, arranged in the effective pixel area 800, FIG. 8, of the alternative embodiment. As shown, the cell 120 includes an N-type semiconductor substrate 105 formed with a P-well layer 106. An $N^+$ layer 107 and a $P^+$ layer 108 are sequentially stacked on the top of the P-well layer 106 in this order, constituting the photodiode 100, FIG. 10.

An N-type vertical transfer path 102a is formed at the right-hand side, as viewed in FIG. 11, of the photodiode 100 while a P-type read-out gate 109 for reading out a signal charge is formed between the vertical transfer path 102a and the photodiode 100. A P-type channel stopper 110 is formed at the left-hand side, as viewed in FIG. 11, of the photodiode 100 remote from the vertical transfer path 102a, potentially isolating the vertical transfer path 102a from an N-type vertical transfer path 102b assigned to the adjoining pixel.

Transfer electrode layers 111a and 111b are formed on the vertical transfer paths 102a and 102b, respectively. An optical shield layer 112 is positioned above the transfer electrode layers 111a and 111b and formed with an optical aperture 112a above the photodiode 100. With the aperture 112a, the shield layer 112 allows light to be incident on the photodiode 100 while shielding the vertical transfer paths 102a and 102b from the light. A color filter 113 is stacked on the shield layer 112 while a microlens 114 is formed above the color filter 113.

In the configuration shown in FIG. 11, part component of the light incident on the microlens 114 identical in color with the color filter 113 is transmitted through the color filter 113 and then passed through the aperture 112a of the shield layer 112 to the photodiode 100. As a result, a signal charge corresponding to the amount or intensity of incident light component is generated and stored in the photodiode 100. Subsequently, when a read pulse is applied to a read-out electrode, not shown, the signal charge is read out from the photodiode 100 to the vertical transfer path 102 via the read-out gate.

Thereafter, when a transfer pulse is applied to the transfer electrode layer 111a ($\phi$1, $\phi$2, $\phi$3 or $\phi$4, FIG. 10), the signal charge is transferred to a horizontal transfer path, not shown, via the vertical transfer path 102 (102a or 102b). The signal charge is then output from the image sensor via the horizontal transfer path.

Figure 12:
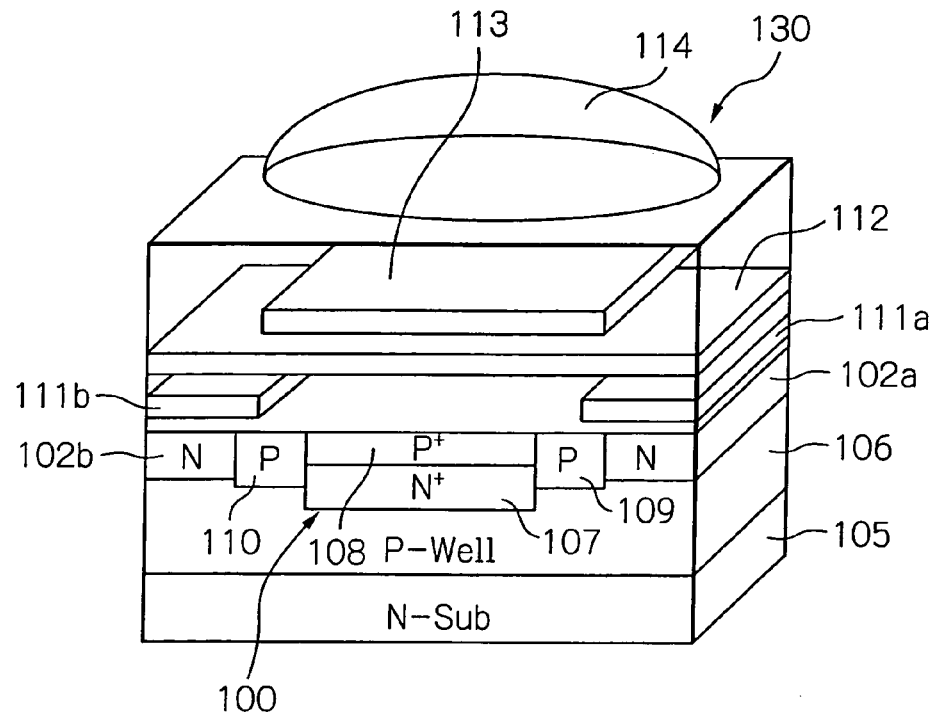
FIG. 12 is a view, similar to FIG. 11, showing a specific configuration of one of the photosensitive cells positioned in an optical black area also included in the image sensor of FIG. 10.

FIG. 12 is a sectional perspective view along the line X-X in FIG. 10 showing a specific configuration of one of the cells or pixels arranged in the optical black area 801, FIG. 8. As shown, the cell, labeled 130, is identical with the cell 120 of FIG. 11 except that the shield layer 112 is not formed with the aperture 112a, FIG. 11, but is configured to optically shield even the photodiode 100 from incident light. In FIG. 12, structural parts and elements like those shown in FIG. 11 are designated by identical reference numerals, and a detailed description thereof will not be made in order to avoid redundancy. In this configuration, the image data or signal charge output from the cell 130 are representative of black and are also sequentially transferred via the vertical and horizontal transfer paths and then output from the image sensor.

Figure 13:
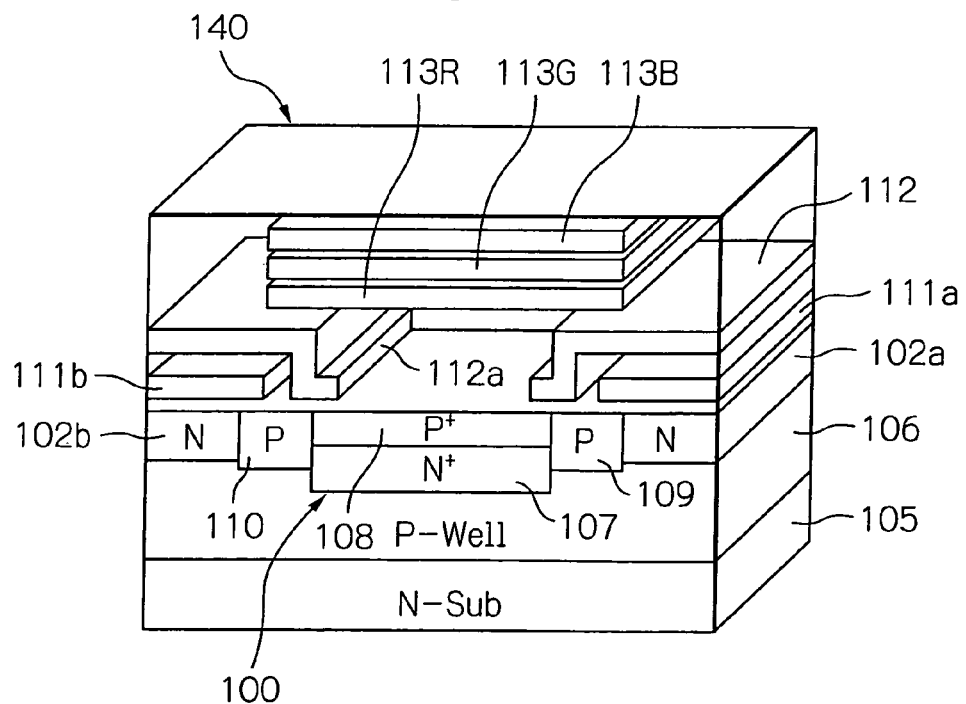
FIG. 13 is a sectional perspective view showing an alternative specific configuration of one of the photosensitive cells positioned in the optical black area of FIG. 10.

FIG. 13 is a sectional perspective view along the line X-X of FIG. 10 showing an alternative specific configuration of the cell positioned in the optical black area 801, FIG. 8. As shown, the cell, labeled 140, is identical with the cell 120 of FIG. 11 in that the shield layer 112 is formed with the aperture 112a, but different from the cell 120 in that a red (R) filter 113R, a green (G) filter 113G and a blue (B) filter 113B are stacked on the shield layer 112 and in that the microlens 114 is omitted in order to reduce the incidence efficiency of light. In FIG. 13 also, structural parts and elements like those shown in FIG. 11 are designated by identical reference numerals, and a detailed description thereof will not be made in order to avoid redundancy.

More specifically, the cell 140 is configured to cause the filters 113R, 113G and 113B to ultimately absorb the entire incident light, thereby preventing the incident light from reaching the photodiode 100. In this configuration, the image data or signal charge output from the cell 140 is also representative of black and is also sequentially transferred via the vertical and horizontal transfer paths and then output from the image sensor.

The cell 130 shown in FIG. 12, positioned in the optical black area 801 is configured to intercept incident light with the shield layer 112. Because the shield layer 112 is usually implemented by a metallic film formed of, e.g. tungsten, light incident on the shield layer 112 is considered to cause a dark current generated in the photodiode 100, and hence the black level, to vary. This is why the cell 140 shown in FIG. 13 absorbs the entire incident light with the color filters 113R, 113G and 113B positioned above the aperture 112a of the shield layer 112.

While the cell 140 of FIG. 13 includes a stack of three color filters 113R, 113G and 113B, the stack may alternatively or additionally include a single color filter of black, if desired. Alternatively, the shield layer 112 of the cell 140 may be adapted to have no aperture 112a formed in addition to the structure described above.

Figure 14:
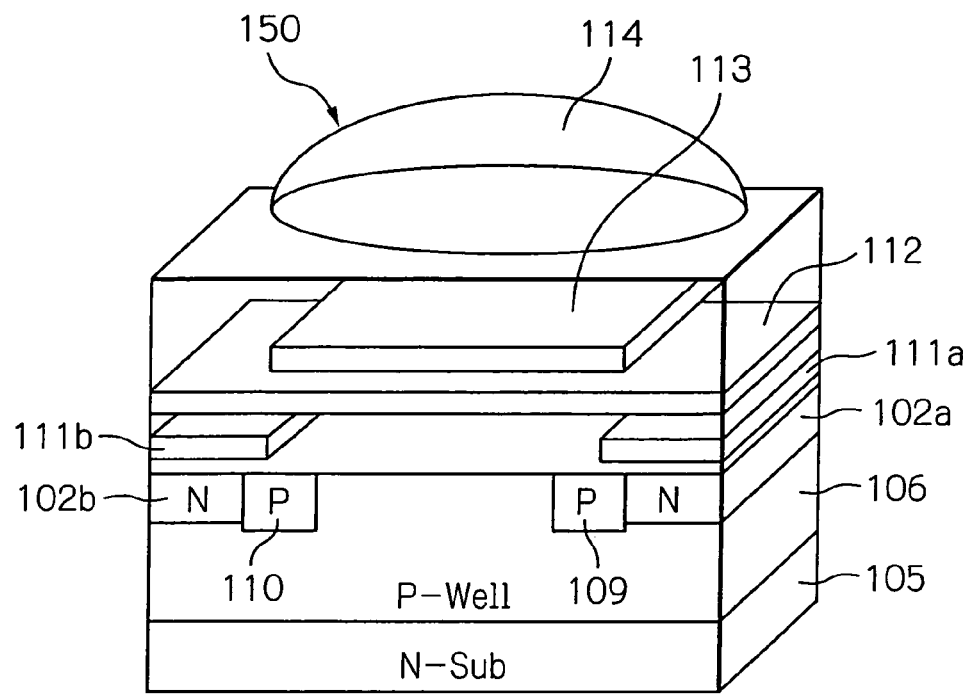
FIG. 14 is a sectional perspective view showing a still alternative specific configuration of one of the photosensitive cells positioned in the optical black area of FIG. 10.

FIG. 14 is a sectional perspective view along the line X-X in FIG. 10 showing a still alternative specific configuration of the cell positioned in the optical black area 801, FIG. 8. As shown, the cell, labeled 150, is identical with the cell 130 of FIG. 12 in that the shield layer 112 is not formed with the aperture but intercepts the entire incident light. The cell 150 is, however, different from the cell 130 in that the photodiode is omitted, or not formed, in order to obviate the variation of the dark current. In FIG. 14 also, structural parts and elements like those shown in FIG. 12 are designated by identical reference numerals, and a detailed description thereof will of course not be made in order to avoid redundancy.

Figure 15:
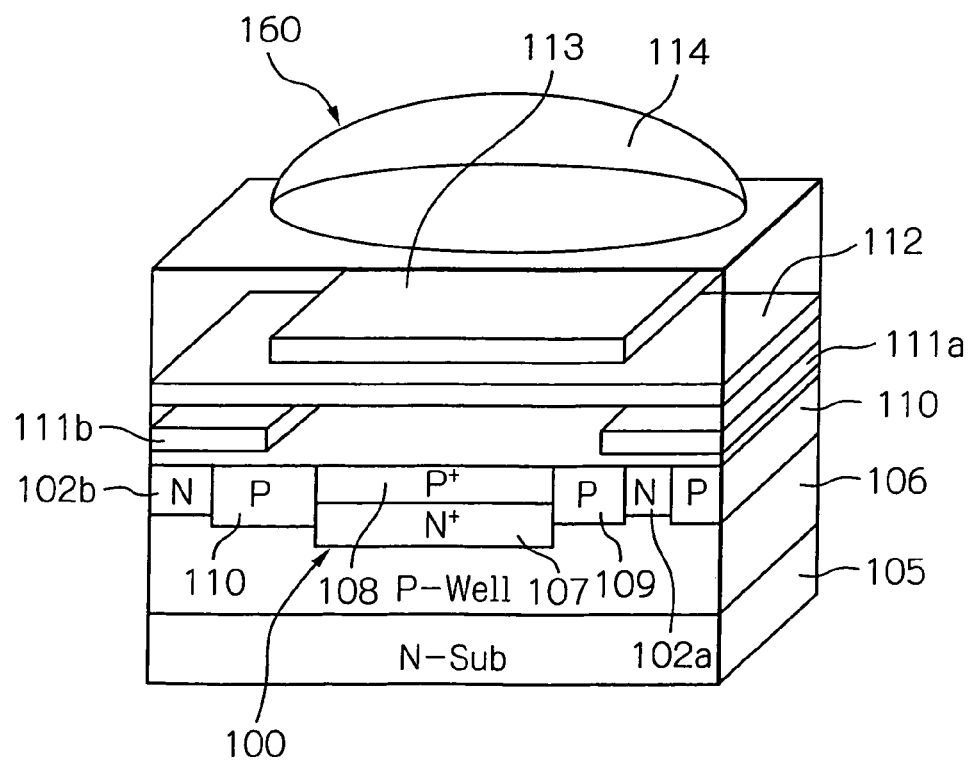
FIG. 15 is a sectional perspective view showing a further specific configuration of one of the photosensitive cells positioned in the optical black area of FIG. 10.

FIG. 15 is a sectional perspective view along the line X-X of FIG. 10 showing a further specific configuration of the cell positioned in the optical black area 801, FIG. 8. As shown, the cell, labeled 160, is identical with the cell 130 of FIG. 12 except that the channel stopper is increased in width while the vertical transfer paths 102a or 102 is correspondingly decreased in width. In FIG. 15, structural parts and elements like those shown in FIG. 12 are designated by the same reference numerals, and a detailed description thereof will not be made in order to avoid redundancy. The width of the vertical transfer path 102a or 102b is reduced because a dark current generated in the vertical transfer path 102a or 102b is predominant over a dark current generated in the photodiode 100.

It has been customary with a solid-state image sensor to arrange, among the cells or pixels 130, 140, 150 and 160 described above with reference to FIGS. 12, 13, 14 and 15, respectively, only the cell 130 shown in FIG. 12 in the optical black area 801, FIG. 8. By contrast, the alternative embodiment allows at least two of the four different cells 130 through 160 to be arranged in the optical black area 801.

For example, cells with the configuration shown in FIG. 12 and cells with the configuration shown in FIG. 13 may be respectively arranged in the left optical black portion 801L and right optical black portion 801R of FIG. 8. Alternatively, cells with the configuration shown in FIG. 12 and cells with the configuration shown in FIG. 13 may be arranged in the right optical black portion 801R in which about thirty pixels are positioned side by side. Further, two of the four different kinds of cells may be respectively arranged in the upper and lower portions of the optical black area 801. In any case, the cells positioned in the optical black area 801 for correcting the black level of image data output from the cells of the effective pixel area 800 are selectively used in the usual pickup mode or a pickup mode in which a dark current is expected to increase.

More specifically, in the usual pickup mode, the output level of the cells with the configuration of FIG. 12 is used as a black level for correcting the black level of image data output from the effective pixel area 800. On the other hand, when a dark current is expected to rise due to, e.g. temperature higher than a predetermined value or sensitivity selected higher than a predetermined value, the output level of the cells with the configuration of FIG. 13 is used as a black level for correcting the black level of image data output from the effective pixel area 800.

FIG. 16 shows black levels output from the image sensor of the alternative embodiment. As shown, assume that a black level a output from each optical black cell 130 rises above the black level b of the effective pixel area 800 due to an increase in dark current which is, in turn, ascribable to temperature elevation or similar cause. Even in such a condition, a black level c output from each optical black cell 140, which is different in structure from the optical black cell 130, is different from the black level a, increasing the possibility that the black level of the effective pixel area 800 can be corrected by the level c on the basis of signal processing.

While the optical black cells 130 through 160 each having particular one of four different structures have been shown and described, it cannot be estimated which of them reduces a dark current most under various pickup conditions. In light of this, in the alternative embodiment, optical black cells having a plurality of different configurations are used in combination. Alternatively, three, four or more kinds of optical black cells may be arranged in combination, in which case optical black cells outputting the lowest black level are used for correcting the black level output from the effective pixel area 800.

It is to be noted that the alternative embodiment is practicable not only with a CCD image sensor shown and described but also with a CMOS (Complementary Metal Oxide Semiconductor) image sensor except for the structure shown in FIG. 15 in which the width of the vertical transfer path is increased.

As stated above, the alternative embodiment selectively uses a plurality of different kinds of cells or pixels arranged in the optical black area in combination in order to enhance accurate correction of the black level of image data, implementing a solid-state image sensor to be mounted on a digital camera, scanner or similar image input apparatus.

In summary, in accordance with the present invention, zones with photodiodes and zones without photodiodes are arranged in an optical black area alternately at predetermined intervals each, so that the influence of light having passed through a shield layer included in the optical black area and that of dark currents generated in photodiodes in a long-exposure mode can be obviated. It follows that a black level output from an effective pixel area can be accurately corrected. Also, the front and rear portions of the optical black area are opposite to each other as to the positions of the zones with photodiodes and zones without photodiodes. This successfully obviates omission otherwise occurring when only the rear optical black portion is clamped, i.e. enhances potential stability by clamping the front optical black portion also.

Further, lines to be clamped in level are switched in accordance with pickup information in order to obviate the influence of, e.g. black regions undesirably rendered practically black. In this case, horizontal scanning lines from which black-level correction data on the basis of the pickup information should be obtained can be determined in accordance with control over the switching of the clamp lines. The clamp-line switching control and clamped lines may be recorded in the form of image pickup information, so that positions where the subtraction of the black level should be effected can be determined in accordance with the above-stated lines in the event of image processing to be executed later. This is desirable in the case where a raw data file is to be processed.

Moreover, a plurality of different kinds of cells or pixels arranged in the optical black area in combination are selectively used in order to enhance accurate correction of the black level of image data.

The entire disclosure of Japanese patent application Nos. 2005-122035 and 2005-162590 respectively filed on Apr. 20, 2005 and Jun. 2, 2005, including the specifications, claims, accompanying drawings and abstracts of the disclosure, are incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A solid-state image sensor comprising:
   an effective pixel area having a plurality of photosensitive cells arranged, each of the plurality of photosensitive cells generating a particular signal charge corresponding to an amount of incident light; and
   an optical black area shielded from the incident light;
      wherein said optical black area is positioned at a front side and a rear side of horizontal scanning lines,
      the horizontal scanning lines comprising first horizontal scanning lines, including first zones in which the photosensitive cells are present, and second horizontal scanning lines, including second zones in which the photosensitive cells are absent, arranged alternately with each other at the front side at predetermined intervals each.

2. The image sensor in accordance with claim 1, wherein said first scanning lines, including third zones in which the photosensitive cells are absent, and said second scanning lines, including fourth zones in which the photosensitive cells are present, are arranged in the rear side.

3. An image pickup apparatus for picking up a field to generate an image signal representative of the field, comprising:
   a solid-state image sensor comprising an effective pixel area having a plurality of photosensitive cells arranged, each of the plurality of photosensitive cells generating a particular signal charge corresponding to an amount of incident light from the field, and an optical black area shielded from said incident light, said optical black area being positioned at a front side and a rear side of horizontal scanning lines, the horizontal scanning lines comprising first horizontal scanning lines, including first zones in which the photosensitive cells are present, and second horizontal scanning lines, including second zones in which the photosensitive cells are absent, arranged alternately with each other at the front side at predetermined intervals each;

a driver for causing said solid-state image sensor to output an image signal in accordance with exposure;

an analog circuit for clamping the image signal output from said solid-state image sensor; and a controller for controlling clamping executed by said analog circuit;

said controller causing said analog circuit to selectively clamp the first horizontal scanning lines or the second horizontal scanning lines.

4. The apparatus in accordance with claim 3, wherein said controller causes said analog circuit to selectively clamp the first horizontal scanning lines or the second horizontal scanning lines in accordance with pickup information output when picking up the field.

5. The apparatus in accordance with claim 4, wherein said controller causes said analog circuit to prepare an image file in which information on the horizontal lines clamped is included in the pickup information.

* * * * *